United States Patent [19]

Mun

[11] Patent Number: 5,663,944
[45] Date of Patent: Sep. 2, 1997

[54] VERTICAL CAVITY LASER LIGHT BEAM MONITORED BY REFLECTION OF A HALF MIRROR, WITH APPLICATION IN OPTICAL PICK-UP

[75] Inventor: Jong-kuk Mun, Kyungki-do, Rep. of Korea

[73] Assignee: Samsung Electronics Co., Ltd., Kyungki-do, Rep. of Korea

[21] Appl. No.: 581,339

[22] Filed: Dec. 29, 1995

[51] Int. Cl.$^6$ .................. G11B 7/00; H01S 3/08
[52] U.S. Cl. ............... 369/121; 369/122; 369/116; 369/120; 372/98; 372/102; 372/50
[58] Field of Search .................. 369/121, 120, 369/116, 122; 372/50, 45, 97, 23, 46, 92, 99, 102, 98

[56] References Cited

U.S. PATENT DOCUMENTS

| | | | |
|---|---|---|---|
| 5,132,982 | 7/1992 | Chan et al. | 372/50 |
| 5,136,603 | 8/1992 | Hasnain et al. | 372/50 |
| 5,285,466 | 2/1994 | Tabatabaie | 372/50 |
| 5,295,147 | 3/1994 | Jewell et al. | 372/45 |
| 5,475,701 | 12/1995 | Hibbs-Brenner | 372/50 |

Primary Examiner—Georgia Y. Epps
Assistant Examiner—Kim-Kwok Chu
Attorney, Agent, or Firm—Sughrue, Mion, Zinn, Macpeak & Seas

[57] ABSTRACT

There is provided a device for monitoring the light output of a VCSEL and a recording and reproducing optical pick-up adopting the device. The device for monitoring the light output of a VCSEL has a half mirror positioned in front of a VCSEL, for reflecting a portion of the light emitted from the VCSEL, and a monitoring optical detector positioned behind the VCSEL, for detecting the light reflected from the half mirror. The recording and reproducing optical pick-up employing the device includes a VCSEL having a light-emitting surface for emitting light vertically from the light-emitting surface, a light output monitor for monitoring the light output of the VCSEL, an objective lens for concentrating incident light on an optical recording medium to form an optical spot thereon, a light path changer for changing a path of the light reflected from the optical recording medium, and a first optical detector for receiving the reflected light and detecting an error signal and an information signal. The light output monitor comprises a half mirror positioned in front of the VCSEL, for reflecting a portion of the light emitted from the VCSEL, and a second monitoring optical detector positioned behind the VCSEL, for detecting the light reflected from the half mirror.

4 Claims, 3 Drawing Sheets

5,663,944

VERTICAL CAVITY LASER LIGHT BEAM MONITORED BY REFLECTION OF A HALF MIRROR, WITH APPLICATION IN OPTICAL PICK-UP

BACKGROUND OF THE INVENTION

The present invention relates to a device for monitoring the light output of a vertical cavity surface emitting laser (VCSEL) and a recording/reproducing optical pick-up adopting the device, and more particularly, to a device for monitoring the light output of a VCSEL, which is improved to efficiently monitor the intensity of light emitted from a VCSEL light source, and a recording/reproducing optical pick-up adopting the device.

In general, a device for controlling the light output of a VCSEL includes a monitoring optical detector used as means for controlling the intensity of light emitted from a VCSEL light source.

A VCSEL light source is different from an edge emitting laser light source, in that the former emits light vertically from a stack of semiconductor materials deposited on a substrate, while the latter emits light laterally therefrom. Properties of the VCSEL light source include circular light output, high light intensity, and single mode operation. These advantages make the VCSEL attractive for optical applications such as a light-output device for an optical pick-up, or a computer.

However, since the lower surface of the VCSEL is combined with a semiconductor substrate and thus light is vertically emitted from the upper surface thereof, it is difficult to install a monitoring optical detector.

To overcome this problem, a "Feedback mechanism for VCSEL" is disclosed in U.S. Pat. No. 5,285,466.

This mechanism will be described referring to FIGS. 1–3.

The mechanism is provided with a VCSEL light source 12 for emitting light by application of a forward biased voltage, and an annular monitoring optical detector 14 installed around light source 12, for absorbing spontaneous light emitted laterally from light source 12. Light source 12 and optical detector 14 are integrated on a single semiconductor substrate 10. Optical detector 14 usually employs a VCSEL, and receives light by having no voltage or a reverse biased voltage applied to electrode layers formed on the upper and lower surfaces thereof.

Optical detector 14 receives the lateral light emitted from light source 12, converts the light into an electrical signal, and feeds the signal back to an electrode of light source 12, thereby controlling light emission of light source 12.

However, the intensity of the lateral light emitted from light source 12 is not directly proportional to and is smaller than that of vertical light emitted therefrom. Further, much of the emitted lateral light penetrates through optical detector 14, and is not absorbed therein. Therefore, it is difficult to obtain the light intensity necessary to generate a signal strong enough for controlling the intensity of the vertical light.

As shown in FIG. 2, the vertical light is generated and emitted from light source 12 by forward biased lasing current in mA units. In an analysis of vertical light detected in an optical detector, it is found that there are a lasing threshold 20 and a lasing terminates 22 in the vertical light. When a lasing current between lasing threshold 20 and lasing terminates 22 is applied, a gaussian-shaped output current 24 of several microamperes is generated in the detector, while when any other current is applied, the detected current is almost zero in the detector.

The current amount 34 of lateral light emitted from light source 12 and detected in optical detector 14 is smaller than that of the vertical light emitted from light source 12. A lasing threshold 30 and a lasing terminates 32 of the lateral light are indefinite, and the detector current steadily increases and then decreases according to the strength of applied current. Therefore, since the intensity of the lateral light emitted from VCSEL light source 12 and detected in optical detector 14 is much smaller than that of light emitted from an edge emitting laser light source and detected in a monitoring optical detector, accuracy of light output control is likely to decrease due to noise.

FIG. 3 is a simplified view of another example of a conventional device for controlling the light output of a VCSEL. To overcome the problems described with reference to FIGS. 1 and 2, this device is comprised of at least two VCSELs 50 and 51 provided in parallel on a single semiconductor 40 of, for example, an N-type GaAs, and an identical forward biased voltage 52 is applied to VCSELs 50 and 51. Here, VCSELs 50 and 51 both emit light in a vertical direction and in a horizontal direction, at the same time, and the light of VCSEL 50 is proportional to the light of VCSEL 51, due to application of an identical forward biased voltage.

Here, one VCSEL 50 is used as a light source, and the other VCSEL 51 provided with a current sensor 56 where a reverse biased voltage 54 is applied, is used as an optical detector. Therefore, light emission of VCSEL 50 used as the light source is controlled by detecting light emitted from the surface of VCSEL 51. In this case, it is easy to control light emission. However employment of two VCSELs increases the bulk and cost of the apparatus.

SUMMARY OF THE INVENTION

To overcome the above problems, an object of the present invention is to provide a device for monitoring the light output of a VCSEL, which is miniaturized and efficiently monitors the intensity of light emitted from the VCSEL.

Another object of the present invention is to provide an optical pick-up employing the above device for monitoring the light output of a VCSEL.

To achieve the above object, there is provided a device for monitoring the light output of a vertical cavity surface emitting laser (VCSEL) comprising a VCSEL having a light-emitting surface, for emitting light vertically from the light-emitting surface, and means for monitoring light output of the VCSEL, wherein the monitoring means comprises a half mirror positioned in front of the VCSEL, for reflecting a part of the light emitted from the VCSEL, and a monitoring optical detector positioned behind the VCSEL, for detecting light reflected from the half mirror.

To achieve another object, there is provided a recording/reproducing optical pick-up employing a device for monitoring the light output of a VCSEL, the optical pick-up comprising a VCSEL having a light-emitting surface, for emitting light vertically from the light-emitting surface, means for monitoring light output of the VCSEL, an objective lens for concentrating incident light on an optical recording medium to form an optical spot thereon, means for changing a path of the light reflected from the optical recording medium, and a first optical detector for receiving the reflected light and detecting an error signal and an information signal, wherein the monitoring means comprises a half mirror positioned in front of the VCSEL, for reflecting a part of the light emitted from the VCSEL, and a monitoring second optical detector positioned behind the VCSEL, for detecting the light reflected from the half mirror.

DETAILED DESCRIPTION OF THE INVENTION

A preferred embodiment of the present invention will be described in detail, referring to the attached drawings.

Figure 1:
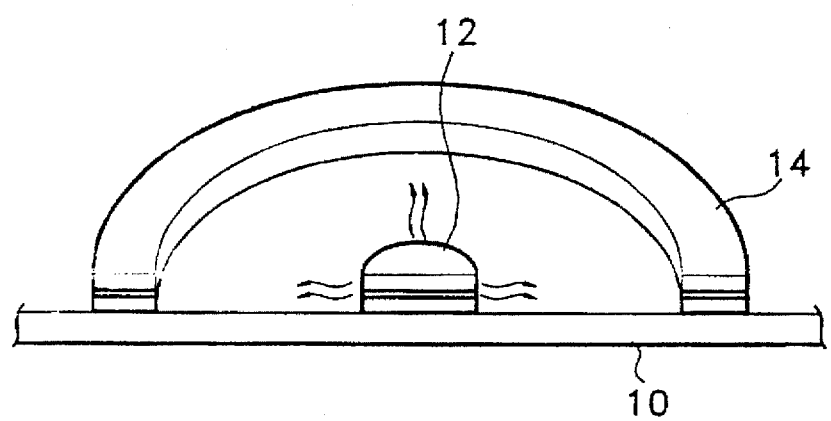
FIG. 1 is a simplified view of an example of a conventional device for controlling the light output of a VCSEL.
Figure 2:
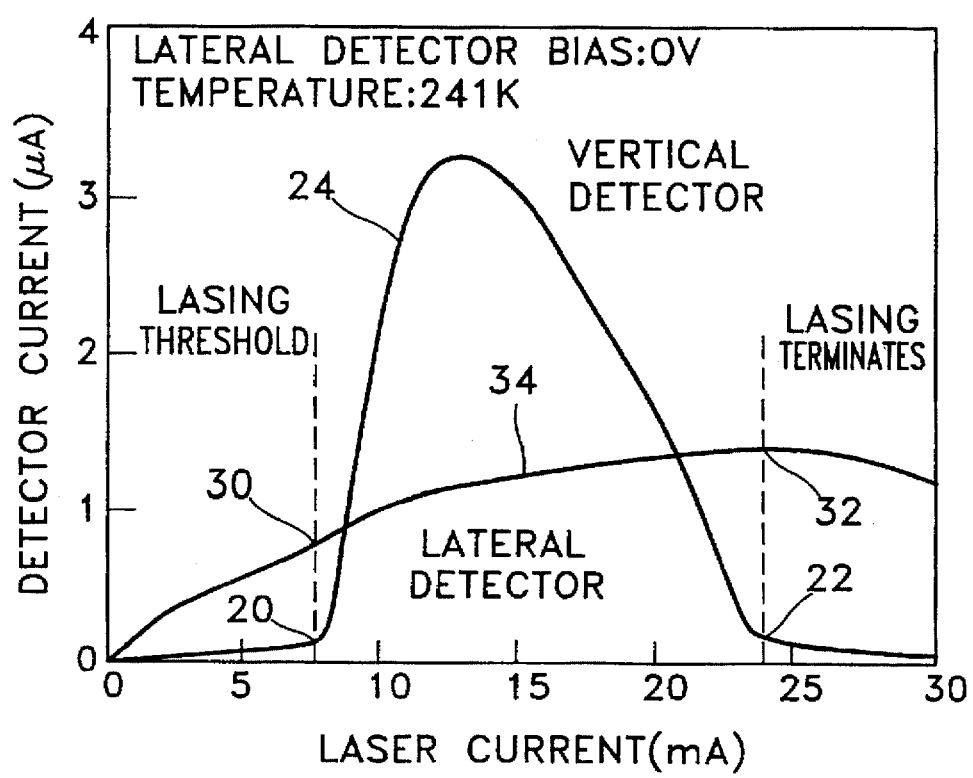
FIG. 2 is a graph of the vertical detector current and the lateral detector current in a conventional VCSEL light source.
Figure 3:
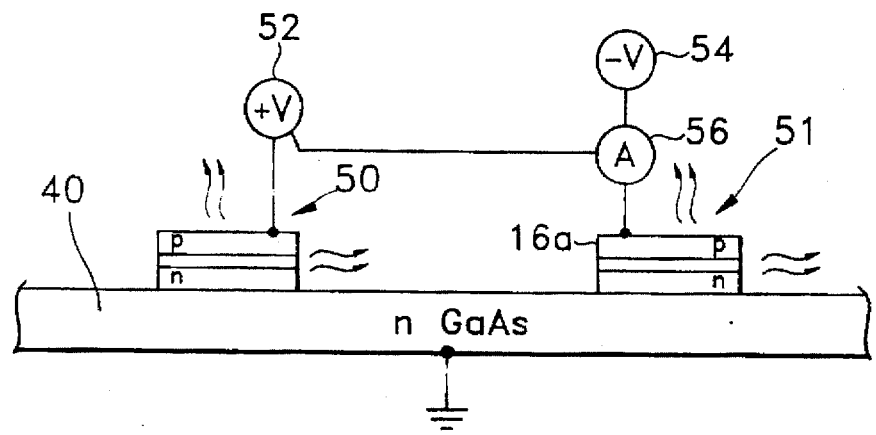
FIG. 3 is a simplified view of another example of a conventional device for controlling the light output of a VCSEL.
Figure 4:
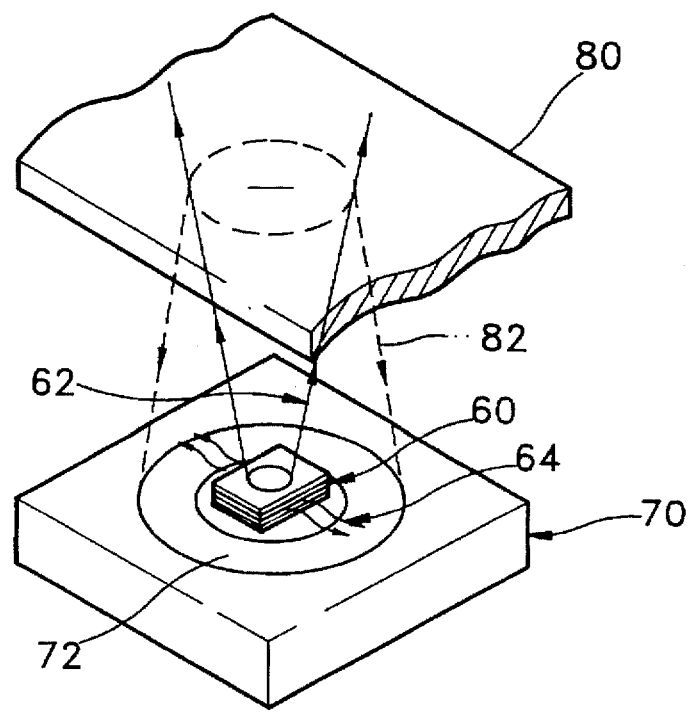
FIG. 4 is a perspective view of a device for monitoring the light output of a VCSEL according to the present invention.

As shown in FIG. 4, a device for monitoring the light output of a VCSEL according to the present invention is comprised of a light source 60 of a stacked structure, for vertically emitting light 62, and monitoring optical detecting means (described below) for controlling the intensity of vertical light 62 emitted from light source 60.

Light source 60 employs a VCSEL. The VCSEL is formed by depositing at least one N-type layer and at least one P-type layer on a substrate. Light is emitted by a quantum-well active region formed between an N-type distributed Bragg reflector (DBR) layer and a P-type DBR layer. The VCSEL is driven, with a forward biased voltage applied thereto. Vertical light 62 and lateral light 64 are emitted by the application of the voltage.

The monitoring optical means is comprised of a half mirror 80 installed above or in front of the light source 60 for partially reflecting and transmitting vertical light 62 at a constant ratio, and a monitoring optical detector 70.

Monitoring optical detector 70 may be formed of a relatively inexpensive silicon semiconductor instead of an expensive compound semiconductor. Optical detector 70 is plate-shaped and light source 60 is mounted thereon. A light-detecting surface 72 is formed around light source 60 on optical detector 70, to receive vertical light 62 emitted from light source 60 and reflected from half mirror 80.

Half mirror 80 is formed of a material for transmitting and reflecting light. Glass or transparent plastic, generally used as the material, transmits most of the light, reflecting only a small portion of the light. 5–10% of incident light is reflected from ordinary glass. To increase the light reflectivity, a half mirror coating method is used. With this method, the intensity of light reflected from half mirror 80 and incident on optical detector 70 can be controlled.

Vertical light 62 emitted from light source 60 is mostly transmitted and partially reflected by half mirror 80 positioned on the axis of light of light source 60. The transmitted light is used for the intented purpose of the light source, and the reflected light 82 is used to control the intensity of light emitted from light source 60. Reflected light 82 reaches optical detecting surface 72 at a reflection angle twice as large as an emission angle at which light is emitted from light source 60. The intensity of reflected light 82 received by optical detecting surface 72 is proportional to the intensity of light emitted from light source 60. In a case where optical detecting surface 72 protrudes upward by a predetermined height, lateral light 64 emitted from light source 60 can also be received and used to generate a control signal.

As described above, since current proportional to the intensity of light emitted from the light source can be obtained, in the optical detector according to the present invention, the intensity of light output of the light source can accurately be controlled according to a corresponding current signal.

Further the use of the single VCSEL allows a product to be small and the use of a cheap silicon semiconductor decreases manufacturing costs.

Figure 5:
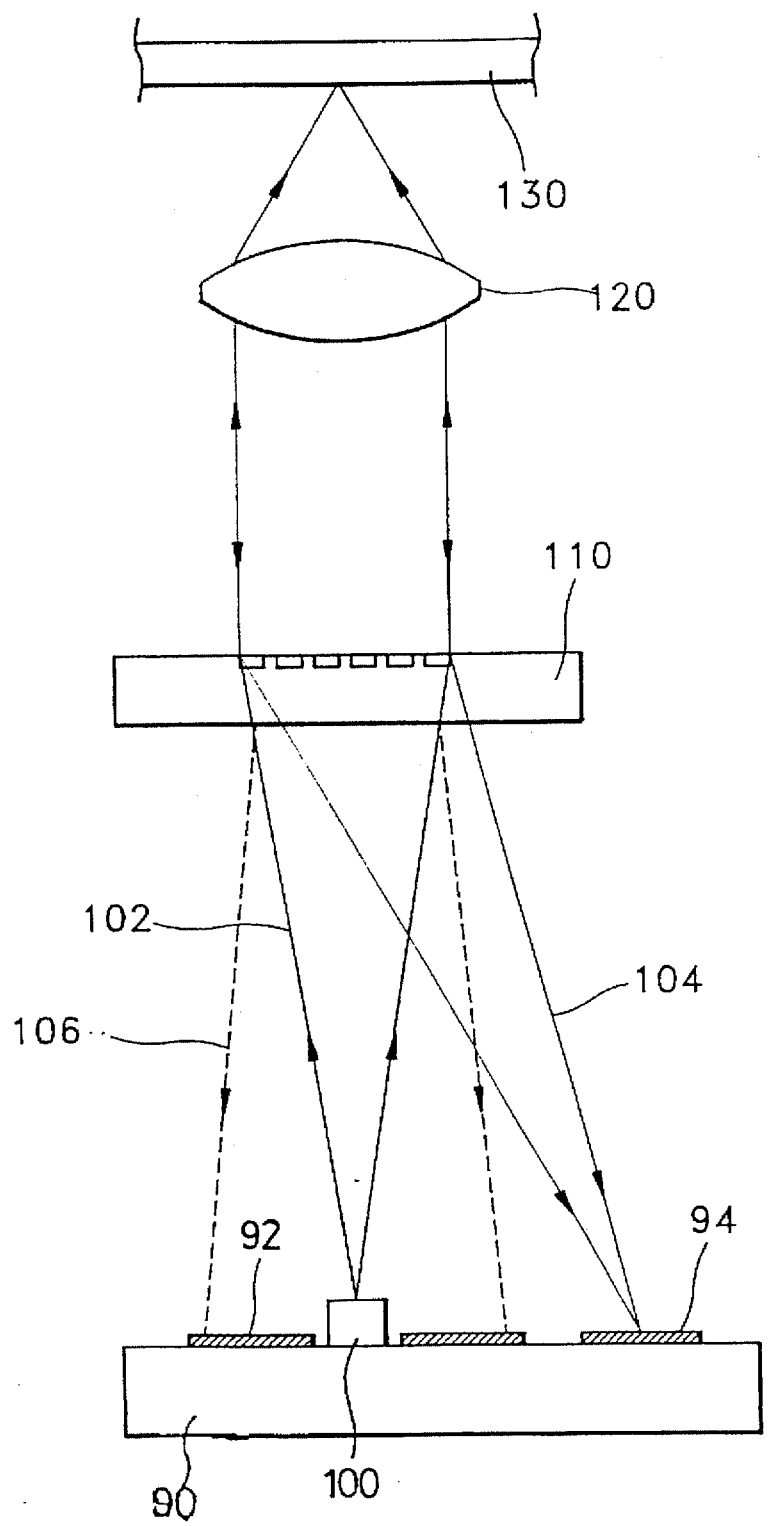
FIG. 5 is a simplified view of a recording/reproducing optical pick-up employing the device for monitoring the light output of a VCSEL according to the present invention.

Referring to FIG. 5, the structure and operation of an optical pick-up employing the above device for monitoring the light output of a VCSEL will be described.

The optical pick-up is comprised of a VCSEL 100 for emitting a vertical light 102, an objective lens 120 for concentrating vertical light 102 on a disk 130 which is an optical recording/reproducing medium, a first optical detector 94 for receiving light 104 reflected from disk 130 and detecting a focusing error signal and a tracking error signal, and optical detecting means (described means) for receiving a part of the light emitted from VCSEL 100 to control light emission of VCSEL 100.

Light path changing means is provided on a light path between VCSEL 100 and optical disk 130, to diffract at a predetermined angle light reflected from the recording surface of optical disk 130. The light path changing means preferably includes a hologram device 110. Hologram device 110 transmits light 102 emitted from VCSEL 100 and diffractively transmits the light reflected from optical disk 130.

The optical detecting means is comprised of a second optical detector 90 and a half mirror. Second optical detector 90 detects light for controlling light emission of VCSEL 100, and supports VCSEL 100. First optical detector 94 is mounted on the upper surface of second optical detector 90 to receive light 104 diffracted by hologram device 110.

Hologram device 110 transmits most of light emitted from VCSEL 100, and reflects a part of the light. This property enables hologram device 110 to simultaneously act as the half mirror of FIG. 4. Here, the reflectivity of hologram device 110 can be increased by coating the lower surface thereof with a reflective material.

The half mirror may be integrated into hologram device 110, or may be provided independently between VCSEL 100 and hologram device 110.

Optical detecting surface 92 on the upper surface of monitoring optical detector 90, receives light 106 reflected from the half mirror of hologram device 110. Monitoring optical detector 90 is not necessarily formed of a compound semiconductor identical to that of VCSEL 100, and thus may be formed of a silicon semiconductor used for a conventional edge emitting laser.

First optical detector 94 and second optical detector 90 can be integrally provided. In this case, second optical detector 90 has a plurality of divided detecting plates. Light received in each divided detecting plate is converted into a current signal. A tracking error signal and a focusing error signal can be detected by the sum and difference of the converted current signals.

Therefore, a compact optical pick-up can be realized.

What is claimed is:

1. A device for monitoring the light output of a vertical cavity surface emitting laser (VCSEL) comprising a VCSEL having a light-emitting surface for emitting light vertically from said light-emitting surface, and means for monitoring light output of said VCSEL;

wherein said monitoring means comprises a half mirror positioned in front of said VCSEL, for reflecting a part of the light emitted from said VCSEL, and a monitoring optical detector positioned behind said VCSEL, for detecting light reflected from said half mirror.

2. A recording/reproducing optical pick-up employing a device for monitoring the light output of a vertical cavity surface emitting laser (VCSEL), said optical pick-up comprising a VCSEL having a light-emitting surface for emitting light vertically from said light-emitting surface, means for monitoring light output of said VCSEL, an objective lens for concentrating the light on an optical recording medium to form an optical spot thereon, means for changing a path of the light reflected from said optical recording medium, and a first optical detector for receiving said reflected light and detecting an error signal and an information signal;

wherein said monitoring means comprises a half mirror positioned in front of said VCSEL, for reflecting a part of the light emitted from said VCSEL, and a monitoring second optical detector positioned behind said VCSEL, for detecting the light reflected from said half mirror.

3. A recording/reproducing optical pick-up as claimed in claim 2, wherein said changing means is a hologram device positioned between said VCSEL and said objective lens, for diffracting light reflected from said optical recording medium toward said first optical detector.

4. A recording/reproducing optical pick-up as claimed in claim 2, wherein said changing means is a hologram device positioned between said VCSEL and said objective lens, for diffracting light reflected from said optical recording medium toward said first optical detector, said changing means having said half mirror formed on a surface thereof by a reflective material coating.

* * * * *